United States Patent
Yokoyama et al.

(10) Patent No.: US 6,802,655 B2
(45) Date of Patent: Oct. 12, 2004

(54) LASER SOURCE

(75) Inventors: Tosifumi Yokoyama, Katano (JP); Yasuo Kitaoka, Ibaraki (JP); Kazuhisa Yamamoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 139 days.

(21) Appl. No.: 10/196,054

(22) Filed: Jul. 16, 2002

(65) Prior Publication Data

US 2003/0012521 A1 Jan. 16, 2003

(30) Foreign Application Priority Data

Jul. 16, 2001 (JP) ........................................ 2001-214974

(51) Int. Cl.[7] .................................................. G02B 6/36
(52) U.S. Cl. ...................................................... 385/88
(58) Field of Search .............................. 385/88–92, 14, 385/129–132; 372/36, 43, 46

(56) References Cited

U.S. PATENT DOCUMENTS

| | | | | |
|---|---|---|---|---|
| 5,412,748 A | * | 5/1995 | Furuyama et al. | 385/92 |
| 5,665,473 A | * | 9/1997 | Okoshi et al. | 428/457 |
| 5,684,902 A | * | 11/1997 | Tada | 385/88 |
| 5,729,561 A | * | 3/1998 | Hironaka | 372/36 |
| 5,793,914 A | * | 8/1998 | Sasaki | 385/49 |
| 5,907,646 A | | 5/1999 | Kitamura | |
| 6,256,437 B1 | * | 7/2001 | Sakushima et al. | 385/49 |
| 6,483,968 B2 | * | 11/2002 | Fuse et al. | 385/49 |
| 6,614,966 B2 | * | 9/2003 | Kitaoka et al. | 385/52 |

OTHER PUBLICATIONS

Yamamoto et al, "Milliwatt–order blue–light generation in a periodically domain–inverted $LiTaO_3$ waveguide" Optics Letters, vol. 16, No. 15, Aug. 1, 1991, pp 1156–1158.

* cited by examiner

Primary Examiner—Thein M. Le
Assistant Examiner—Edwyn Labaze
(74) Attorney, Agent, or Firm—Merchant & Gould P.C.

(57) ABSTRACT

An object of the present invention is to provide a laser source including a submount, an electrode portion formed on the submount, and a semiconductor laser fixed to the electrode portion by means of an adhesive portion, capable of improving the position accuracy of a laser beam emission portion of the semiconductor laser in the height direction. The electrode portion including an electrode for an active region, an electrode for a phase adjustment region, and an electrode for a DBR region is formed on the submount. A plurality of stopper portions also are formed on the submount. The semiconductor laser is fixed to the electrode portion (the electrode for an active region, electrode for a phase adjustment region, and electrode for a DBR region) by means of solder as an adhesive while being in contact with the stopper portions.

14 Claims, 11 Drawing Sheets

LASER SOURCE

BACKGROUND OF THE INVENTION

1. Field of the Invention

The present invention relates generally to a laser source with a semiconductor laser and an optical waveguide device that are mounted on a submount.

2. Description of the Related Art

In order to achieve increases in the density of optical disks and in definition of display, a small short-wavelength light source is required. As the small short-wavelength light source, a coherent source has been attracting attention that is provided with a semiconductor laser and an optical waveguide type second harmonic generation (hereinafter, referred to as "SHG") device employing a quasi-phase-matching (hereinafter, referred to as "QPM") system (see Yamamoto et al., Optics Letters Vol. 16, No. 15, p. 1156, (1991)). Hereinafter, the optical waveguide type SHG device employing the QPM system is referred to as an "optical waveguide type QPM-SHG device".

FIG. 11 shows a schematic configuration of a bluish purple light source using an optical waveguide type QPM-SHG device. A wavelength-variable semiconductor laser 44 having a distributed Bragg reflection (hereinafter, referred to as "DBR") region (hereinafter referred to as a "DBR semiconductor laser") is used as a semiconductor laser. The DBR semiconductor laser 44 is a 100-mW class AlGaAs-based wavelength-variable DBR semiconductor laser in a 820-nm range. The DBR semiconductor laser 44 includes an active region 45, a phase adjustment region 46, and a DBR region 47. By controlling a current injected into the phase adjustment region 46 and the DBR region 47 at a certain ratio, an oscillation wavelength can be varied successively.

An optical waveguide type QPM-SHG device 48 as a wavelength conversion device includes an optical waveguide 50 and a region 51 whose polarization is reversed periodically, which are formed on an X-cut MgO-doped LiNbO$_3$ substrate 49 as a ferroelectric substrate. The optical waveguide 50 is formed by proton exchange. The DBR semiconductor laser 44 and the optical waveguide type QPM-SHG device 48 are fixed to a submount 52 in such a manner that the surface of the DBR semiconductor laser 44 on which an active layer is formed and the surface of the optical waveguide type QPM-SHG device 48 on which the optical waveguide 50 is formed face the submount 52. A laser beam emitted from a laser beam emission portion 53 of the DBR semiconductor laser 44 is coupled directly to a laser beam entrance portion 54 of the optical waveguide 50 of the optical waveguide type QPM-SHG device 48. By carrying out an optical coupling adjustment with a laser beam being emitted from the DBR semiconductor laser 44, a 60-mW laser beam is coupled to the optical waveguide 50 with respect to a 100-mW laser output. Further, by controlling an amount of the current injected into the phase adjustment region 46 and the DBR region 47 of the DBR semiconductor laser 44, the oscillation wavelength is fixed within the allowable range of the phase matching wavelength of the optical waveguide type QPM-SHG device 48, which allows about 20-mW bluish purple light having a wavelength of 410 nm to be obtained.

Hereinafter, a configuration and a method of fabricating a laser source will be described with reference to FIG. 8.

The laser source is fabricated by disposing an optical waveguide type QPM-SHG device (optical waveguide type wavelength conversion device) 48 and a DBR semiconductor laser 44 on a submount 52. In this case, the DBR semiconductor laser 44 is fixed onto the submount 52 using solder 55 as an adhesive in such a manner that the surface of the DBR semiconductor laser 44 on which an active layer 56 is formed faces the submount 52. On the other hand, the optical waveguide type QPM-SHG device 48 is fixed onto the submount 52 with an adhesive 57 in such a manner that the surface of the optical waveguide type QPM-SHG device 48 on which the optical waveguide 50 is formed faces the submount 52. The height of the optical waveguide type QPM-SHG device 48 in the vertical direction is adjusted with spacers 58.

When fabricating this module, a device is used that mounts the optical waveguide type QPM-SHG device 48 and the DBR semiconductor laser 44 on the submount 52 by recognizing alignment markers formed on the optical waveguide type QPM-SHG device 48 and the DBR semiconductor laser 44 through image processing and positioning them using the alignment markers thus recognized. In this case, an important factor to be considered is how efficiently a laser beam emitted from the DBR semiconductor laser 44 is coupled to the optical waveguide 50. Particularly, in the short-wavelength light source including the DBR semiconductor laser 44 and the optical waveguide type QPM-SHG device 48, the power of harmonic light obtained is proportional to the square of a power of the fundamental wave to be coupled to the optical waveguide 50. Therefore, improving the optical coupling efficiency and reducing variations in the coupling efficiency among samples are particularly important.

In order to achieve high-efficiency optical coupling, it is important that the distance between a laser beam emission portion 59 of the DBR semiconductor laser 44 and a laser beam entrance portion 60 of the optical waveguide 50 of the optical waveguide type QPM-SHG device 48 is short and that the positions of the laser beam emission portion 59 and the laser beam entrance portion 60 in the horizontal direction (i.e., Y-direction) and the vertical direction (i.e., Z-direction) coincide with each other. Particularly, the position accuracy in the vertical direction is important. The optical coupling efficiency decreases significantly when there is misalignment in the vertical direction. Therefore, it is necessary that the misalignment of the laser beam entrance portion 60 of the optical waveguide 50 of the optical waveguide type QPM-SHG device 48 with respect to the emission portion 59 of the DBR semiconductor laser 44 is within ±0.2 μm.

The distance $d_a$ from the lower surface of the DBR semiconductor laser 44 to the laser beam emission portion 59 is controlled with high precision when fabricating the DBR semiconductor laser 44. Also, the position of the laser beam entrance portion 60 of the optical waveguide 50 is controlled with high precision since the optical waveguide 50 of the optical waveguide type QPM-SHG device 48 is formed on the surface of a LiNbO$_3$ substrate 49. In addition, since the variations in size of the spacers 58 used for the position adjustment of the optical waveguide type QPM-SHG device 48 in the vertical direction are not more than ±0.1 μm, the position adjustment of the laser beam entrance portion 60 in the vertical direction can be carried out with high precision. However, in order to achieve the position adjustment in the vertical direction with high precision so that a laser beam emitted from the DBR semiconductor laser 44 is coupled to the optical waveguide 50 with high efficiency, it is necessary to control the thickness of the solder 55 as an adhesive for fixing the DBR semiconductor laser 44.

FIGS. 9A and 9B show a conventional submount. FIG. 9A is a plan view and FIG. 9B is a front view. A submount 52 is formed using a Si substrate. On the submount 52, an electrode portion is formed that includes an electrode 61 for an active region, an electrode 62 for a phase adjustment region, an electrode 63 for a DBR region, and an electrode 64 for a ground. Films of the solder 55 as an adhesive portion for fixing a DBR semiconductor laser are formed on the electrodes 61 to 63 (not on the electrode 64 for a ground), respectively. Alignment markers 65 used for the position adjustment of a DBR semiconductor laser and an optical waveguide device fixing portion 66 further are formed on the submount 52. The electrode 61 for an active region, the electrode 62 for a phase adjustment region, the electrode 63 for a DBR region, the electrode 64 for a ground, the alignment markers 65, and the optical waveguide device fixing portion 66 are formed by sputtering and have the same thickness (0.5 μm). The thickness of the films of the solder 55 is 3 μm.

Next, a conventional method for fixing a DBR semiconductor laser to a submount will be described with reference to FIGS. 10A and 10B. First, as shown in FIG. 10A, a DBR semiconductor laser 44 is brought above a solder 55 following alignment markers 65. Next, as shown in FIG. 10B, the DBR semiconductor laser 44 is placed on the solder 55 while applying a load thereto. The submount 52 is heated by a heater to melt the solder 55 and then cooled. The DBR semiconductor laser 44 thus is fixed on the submount 52. The position control of the laser beam emission portion 59 of the DBR semiconductor laser 44 in the height direction conventionally has been carried out by controlling the load applied to the DBR semiconductor laser 44 when fixing the DBR semiconductor laser 44, the temperature for melting the solder 55, and the thickness of the films of the solder 55 as an adhesive portion for fixing the DBR semiconductor laser 44. However, after the DBR semiconductor laser 44 has been fixed, the films of the solder 55 have a thickness of 2±0.5 μm. That is, the thickness of the films of the solder 55 shows variations of ±0.5 μm. This causes the position of the laser beam emission portion 59 of the DBR semiconductor laser 44 in the height direction to vary ±0.5 μm, which makes it difficult to achieve high-efficiency optical coupling stably.

Thus, in order to achieve high-efficiency optical coupling stably, the mounting accuracy needs to be improved further. In addition, the DBR semiconductor laser 44 may be mounted in an inclined manner so that the contact area between the DBR semiconductor laser 44 and the films of the solder 55 as an adhesive portion varies among samples, which may result in variations in characteristics of the DBR semiconductor laser 44 among samples and a shortened lifetime of the DBR semiconductor laser 44 due to the degraded heat dissipation. Moreover, when mounting the DBR semiconductor laser 44 on the submount 52, the DBR semiconductor laser 44 may warp, which may result in variation in characteristics of the DBR semiconductor laser 44 among samples and a degraded reliability of the lifetime of the DBR semiconductor lasers 44. Therefore, in view of the above-mentioned problems, achieving high-efficiency optical coupling and improving the characteristics of the DBR semiconductor laser 44 have been desired.

SUMMARY OF THE INVENTION

In order to solve the above-mentioned problems, a laser source according to the present invention includes a submount, an electrode portion formed on the submount, and a semiconductor laser fixed to the electrode portion by means of an adhesive portion, wherein the submount comprises a stopper portion, and the semiconductor laser is fixed to the electrode portion by means of the adhesive portion while being in contact with the stopper portion.

In the above-mentioned laser source according to the present invention, it is preferable that relationships of $d_1 < d_2$ and $d_1 + d_3 \cong d_2$ are satisfied, where $d_1$ denotes a thickness of the electrode portion, $d_2$ denotes a thickness of the stopper portion as measured from an upper surface of the submount, and $d_3$ denotes a thickness of the adhesive portion.

Further, in the above-mentioned laser source according to the present invention, it is preferable that the submount comprises a plurality of stopper portions.

Furthermore, in the above-mentioned laser source according to the present invention, it is preferable that an adhesive portion having a predetermined width is formed along an optical waveguide portion of the semiconductor laser, pairs of stopper portions face each other with the adhesive portion intervening therebetween, and a distance between the stopper portions facing each other is greater than the predetermined width of the adhesive portion and smaller than a width of the semiconductor laser.

Still further, in the above-mentioned laser source according to the present invention, it is preferable that the stopper portion is formed at a position apart from the electrode portion.

Still further, in the above-mentioned laser source according to the present invention, it is preferable that a groove is formed between the stopper portion and the electrode portion.

Still further, in the above-mentioned laser source according to the present invention, it is preferable that the semiconductor laser and the electrode portion are electrically contacted with each other via the adhesive portion.

Still further, in the above-mentioned laser source according to the present invention, it is preferable that the laser source further includes an optical waveguide device, which is disposed on the submount.

In this case, it is preferable that an optical waveguide device fixing portion for fixing the optical waveguide device is formed on the submount, and a thickness of the optical waveguide device fixing portion is substantially the same as that of the stopper portion as measured from an upper surface of the submount. In this case, it is preferable that the stopper portion and the optical waveguide device fixing portion are formed at the same time by the same process. Also, in this case, it is preferable that the stopper portion and the optical waveguide device fixing portion are formed by sputtering or plating. Also, in this case, it is preferable that a surface material of the optical waveguide device fixing portion is at least one material selected from the group consisting of Al, Cr, Ta, Ti, Si, Cu, Mo, and W. Also, in this case, it is preferable that the stopper portion and the optical waveguide device fixing portion are formed by etching.

Still further, in this case, it is preferable that the optical waveguide device is fixed to the submount with an ultraviolet curable resin via a spacer.

These and other advantages of the present invention will become apparent to those skilled in the art upon reading and understanding the following detailed description with reference to the accompanying figures.

DETAILED DESCRIPTION OF THE INVENTION

Hereinafter, the present invention will be described more specifically by way of embodiments.

In the following embodiments, a submount for a laser source capable of providing high-efficiency optical coupling between a semiconductor laser and an optical waveguide device will be described.

First Embodiment

In the present embodiment, a wavelength-variable DBR semiconductor laser having a DBR region (hereinafter, referred to as a "DBR semiconductor laser) is used. Further, as an optical waveguide device, an optical waveguide type wavelength conversion device (for example, an optical waveguide type QPM-SHG device) is used.

In a laser source including a DBR semiconductor laser and an optical waveguide type wavelength conversion device, improving the optical coupling efficiency is important. The reason for this is that, in a short-wavelength light source utilizing a second harmonic wave generation, which includes a DBR semiconductor laser and an optical waveguide type wavelength conversion device, the power of harmonic light obtained is proportional to the square of a power of the fundamental wave to be coupled to an optical waveguide of the optical waveguide type wavelength conversion device.

Figure 1A:
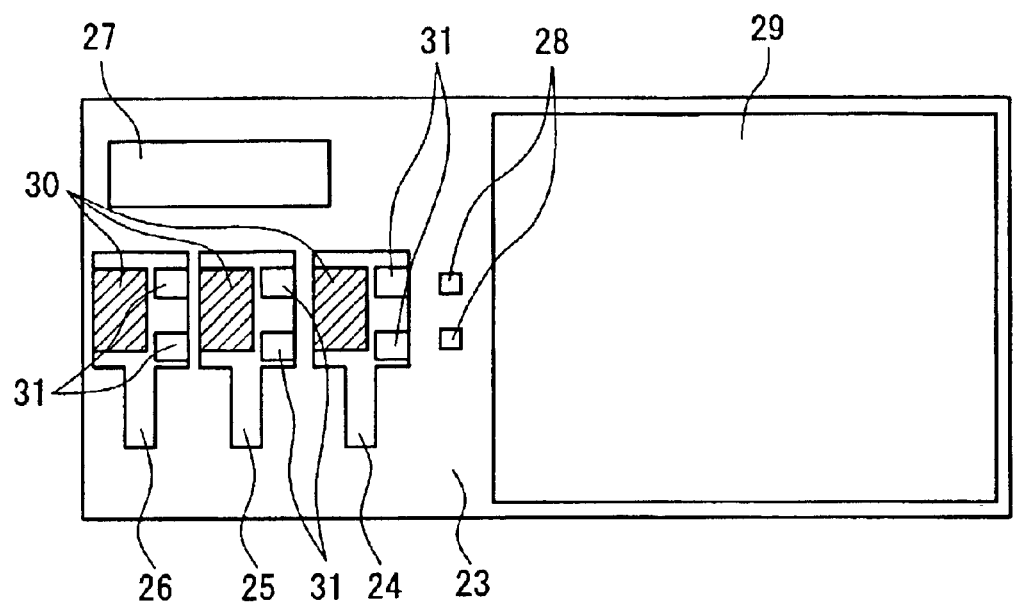
FIG. 1A is a plan view showing a submount for a laser source according to a first embodiment of the present invention.
Figure 1B:
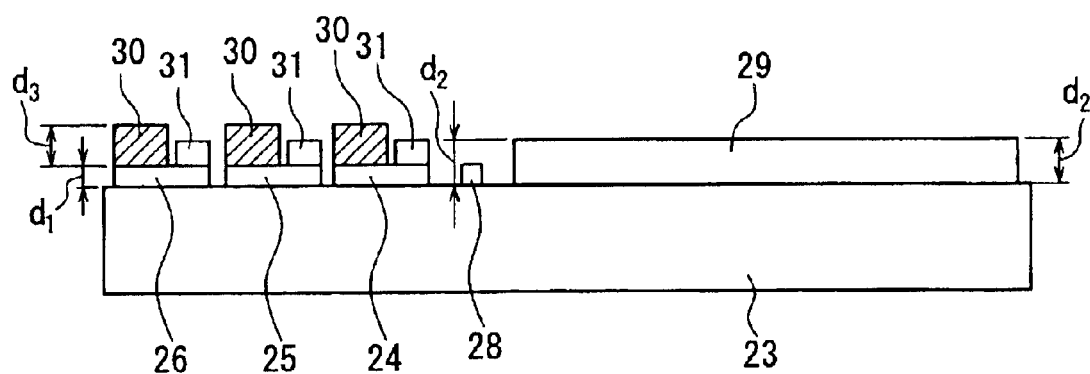
FIG. 1B is a front view of the same.

FIGS. 1A and 1B show a submount according to the first embodiment of the present invention. A submount 23 according to the present embodiment also is formed using a Si substrate. On the submount 23, an electrode portion is formed that includes an electrode 24 for an active region, an electrode 25 for a phase adjustment region, an electrode 26 for a DBR region, and an electrode 27 for a ground, similar to the case of a conventional submount. Films of the solder 30 as an adhesive portion for fixing a DBR semiconductor laser are formed on the electrodes 24 to 26 (not on the electrode 27 for a ground), respectively. Although the present embodiment employs the solder 30 as an adhesive for fixing the DBR semiconductor laser, another conductive adhesive also may be used. Alignment markers 28 used for the position adjustment of a DBR semiconductor laser and an optical waveguide device fixing portion 29 further are formed on the submount 23.

The optical waveguide device fixing portion 29 occupies approximately the entire half on one side of the upper surface of the rectangular submount 23. The electrode 24 for an active region, the electrode 25 for a phase adjustment region, and the electrode 26 for a DBR region are formed on the other side of the upper surface of the submount 23 in this order from the side closer to the optical waveguide device fixing portion 29, and may be positioned substantially along a center line of the submount 23. A pair of alignment markers 28 used for the position adjustment of the DBR semiconductor laser is formed between the optical waveguide device fixing portion 29 and the electrode 24 for an active region.

The films of the solder 30 are formed on the side farther from the optical waveguide device fixing portion 29 of the upper surfaces of the electrodes 24 to 26, respectively. Further, on the upper surface of each of the electrodes 24 to 26, a pair of stopper portions 31 is formed in a region where the film of the solder 30 is not formed.

The electrode 24 for an active region, the electrode 25 for a phase adjustment region, the electrode 26 for a DBR region, the electrode 27 for a ground, the alignment markers 28, and the optical waveguide device fixing portion 29 may be formed by sputtering Ti, Pt, and Au in this order. Ti, Pt, and Au are sputtered so as to have thicknesses of 0.2 $\mu$m, 0.2 $\mu$m, and 0.1 $\mu$m, respectively. Au, which is to be an electrode surface, is chemically stable and thus is suitable as an electrode material.

In a conventional submount, an electrode for an active region, an electrode for a phase adjustment region, an electrode for a DBR region, an electrode for a ground, alignment markers, and an optical waveguide device fixing portion have the same thickness (0.5 $\mu$m). In contrast, in the submount 23 according to the present embodiment, they are not formed so as to have the same thickness.

Specifically, the alignment markers 28, the electrode 24 for an active region, the electrode 25 for a phase adjustment region, the electrode 26 for a DBR region, and the electrode 27 for a ground have a thickness $d_1$ of 0.5 $\mu$m; the stopper portions 31 have a thickness (i.e., the height measured from the upper surface of the submount 23) $d_2$ of 2 $\mu$m; and the films of the solder 30 have a thickness (i.e., the height measured from the electrode surface) $d_3$ of 2.5 $\mu$m. The optical waveguide device fixing portion 29 also has a thickness of 2 $\mu$m. The thickness $d_2$ of the stopper portions 31 is set to be greater than the thickness $d_1$ of the electrodes so as to achieve the position control of the laser beam emission portion of the DBR semiconductor laser in the height direction with high precision. In addition, in order to ensure the bonding between the DBR semiconductor laser and the films of the solder 30, these thicknesses are adapted so as to satisfy the relationship of $d_1+d_3 \geq d_2$.

Hereinafter, a method for fixing a DBR semiconductor laser to a submount according to the present embodiment will be described with reference to FIGS. 2A and 2B. In a submount 23 shown in FIGS. 2A and 2B, films of solder 30 having a predetermined width are formed on the upper surfaces of respective electrodes 24 to 26 along an optical waveguide portion of a DBR semiconductor laser. Further, on the upper surface of each of the electrodes 24 to 26, a pair of stopper portions 31 face each other with the film of the solder 30 intervening therebetween.

Figure 2A:
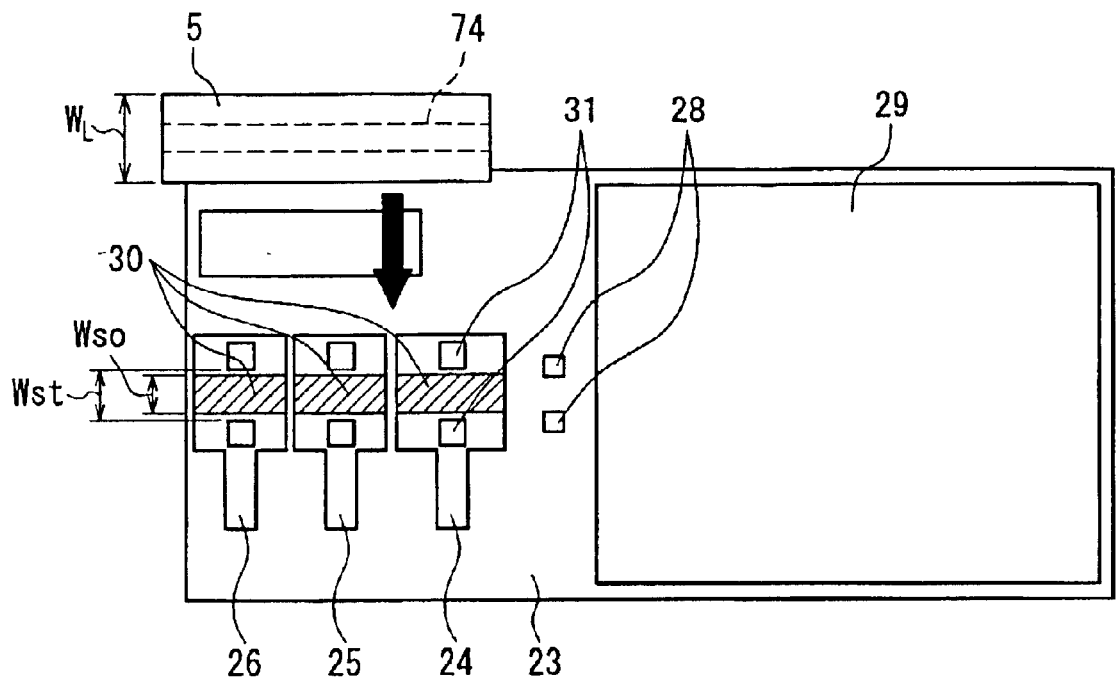
FIG. 2A is a plan view illustrating a method for fixing a semiconductor laser to a submount for a laser source according to the first embodiment of the present invention.
Figure 2B:
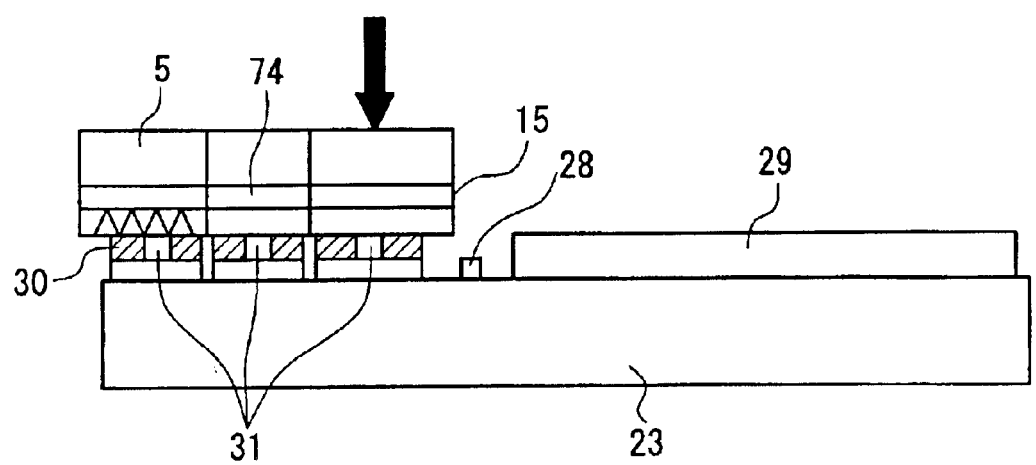
FIG. 2B is a front view of the same.

First, as shown in FIG. 2A, a DBR semiconductor laser 5 is brought above the films of the solder 30 following the alignment markers 28. Next, as shown in FIG. 2B, the DBR semiconductor laser 5 is placed on the films of the solder 30 while applying a load thereto. The submount 23 is heated by a heater to melt the solder 30 and then cooled. The DBR semiconductor laser 5 thus is fixed on the submount 23.

According to the submount 23 of the present embodiment, the position of the laser beam emission portion 15 of the DBR semiconductor laser 5 in the height direction is controlled by the stopper portions 31.

By melting the solder 30 while applying a load to the DBR semiconductor laser 5, the DBR semiconductor laser 5 is pressed down to reach the upper surface of the stopper portions 31 while decreasing the thickness $d_3$ of the films of the solder 30. Thus, after the DBR semiconductor laser 5 has been fixed on the submount 23, the relationship of $d_1+d_3 \cong d_2$ is satisfied. The DBR semiconductor laser 5 does not go downward any further, which allows the position control of the laser beam emission portion 15 of the DBR semiconductor laser 5 in the height direction to be achieved with high precision. Moreover, since the position control of the laser beam emission portion 15 of the DBR semiconductor laser 5 in the height direction can be achieved with high precision by the stopper portions 31, variations in the contact areas between the DBR semiconductor laser 5 and the films of the solder 30 can be reduced. As a result, heat dissipation in the respective samples can be stabilized, thereby reducing variations in various characteristics (e.g., an output characteristic) of the DBR semiconductor laser 5 among samples.

The submount 23 may include a plurality of the stopper portions 31. By providing a plurality of the stopper portions 31 on the submount 23, the DBR semiconductor laser 5 is prevented from being mounted in an inclined manner. Therefore, the position of the laser beam emission portion 15 of the DBR semiconductor laser 5 in the height direction can be controlled stably. In addition, by providing a plurality of the stopper portions 31, the load applied to the DBR semiconductor laser 5 at the time of mounting the DBR semiconductor laser 5 is dispersed into the respective stopper portions 31, which allows the DBR semiconductor laser 5 to be less prone to warp.

Although a variety of arrangements of the stopper portions 31 can be considered, the arrangement as shown in FIG. 2A is more preferable than that shown in FIG. 1A. According to the arrangement as shown in FIG. 2A, the contact area between an optical wave guide portion 74 and the films of the solder 30 as an adhesive portion can be increased by making the distance Wst between each pair of the stopper portions 31 greater than the width Wso, in the direction perpendicular to the optical wave guide portion 74 of the DBR semiconductor laser 5, of the films of the solder 30 as an adhesive portion for fixing the DBR semiconductor laser 5. Therefore, it becomes possible to improve the heat dissipation in the DBR semiconductor laser 5. However, it is to be noted here that the distance Wst between each pair of stopper portions 31 needs to be smaller than the width WL of the DBR semiconductor laser 5 to carry out the position control of the DBR semiconductor laser 5 in the height direction. By using the submount 23 according to the present embodiment, the variation in the position of the laser beam emission portion 15 in the height direction is improved to ±0.1 μm from ±0.5 μm as in the case of the conventional submount.

Figure 3A:
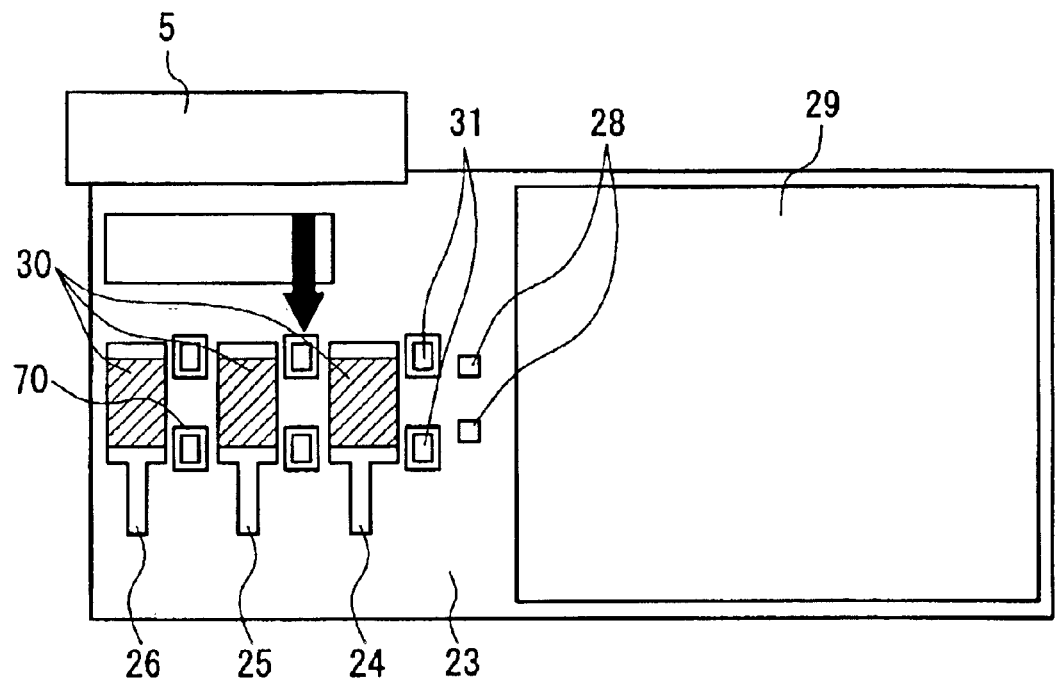
FIG. 3A is a plan view showing another example of a submount for a laser source according to the first embodiment of the present invention.
Figure 3B:
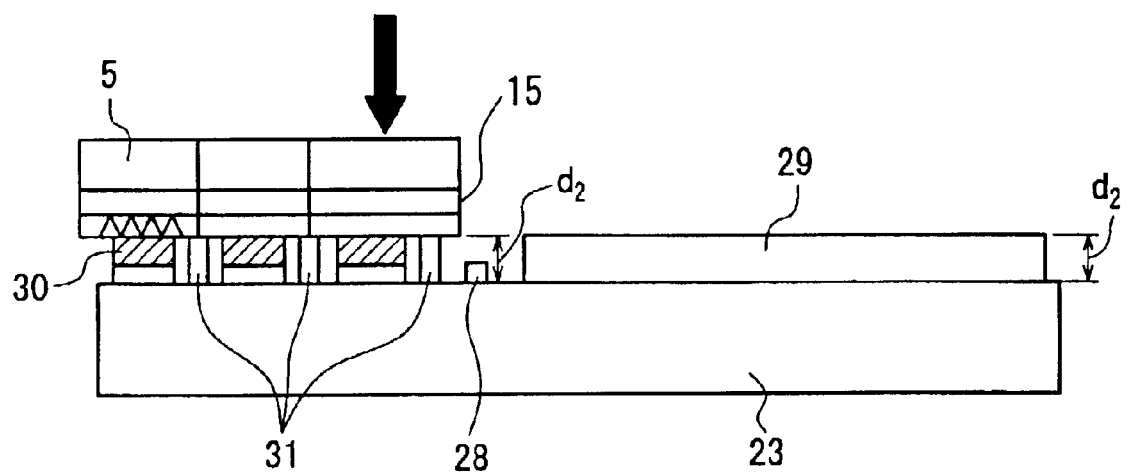
FIG. 3B is a front view of the same.

In order to achieve the position control of the laser beam emission portion 15 in the height direction with such high precision, the DBR semiconductor laser 5 should be mounted in the state where the DBR semiconductor laser 5 is in direct contact with the stopper portions 31. In order to prevent solder and the like from being sandwiched between the stopper portions 31 and the DBR semiconductor laser 5, thereby decreasing the mounting accuracy of the DBR semiconductor laser 5, the stopper portions 31 may be formed at positions apart from the electrodes 24 to 26 as shown in FIGS. 3A and 3B. The solder 30 spreads on the electrodes 24 to 26 when melted. However, this configuration can prevent the solder 30 from flowing into the stopper portions 31. As a result, this prevents the phenomenon of the solder 30 being sandwiched between the DBR semiconductor laser 5 and the stopper portions 31, which allows the position control of the laser beam emission portion 15 in the height direction with high precision to be achieved more stably.

Further, by forming a groove 70 between the stopper portions 31 and the electrodes 24 to 26, it becomes possible to prevent the solder 30 from flowing into the stopper portions 31 more effectively. In the present embodiment, a groove 70 is formed around each stopper portion 31. The groove 70 can be formed by etching or the like.

Furthermore, in the submount 23 according to the present embodiment, the thickness of the optical waveguide device fixing portion 29 is set to be the same as that of the stopper portions 31, as shown in FIGS. 1 and 3. By setting the thickness d of the optical waveguide device fixing portion 29 to be the same as the thickness $d_2$ of the stopper portions 31, the position control of the DBR semiconductor laser 5 and the optical waveguide type wavelength conversion device in the height direction can be achieved easily. Accordingly, high-efficiency optical coupling between a laser beam emitted from the DBR semiconductor laser 5 and the optical waveguide of the optical waveguide type wavelength conversion device can be achieved easily. In addition, according to the above-mentioned configuration, the fabrication process can be simplified. Specifically, the stopper portions 31 and the optical waveguide device fixing portion 29 can be formed at the same time by sputtering so that their thicknesses are adapted to be the same easily.

Figure 4:
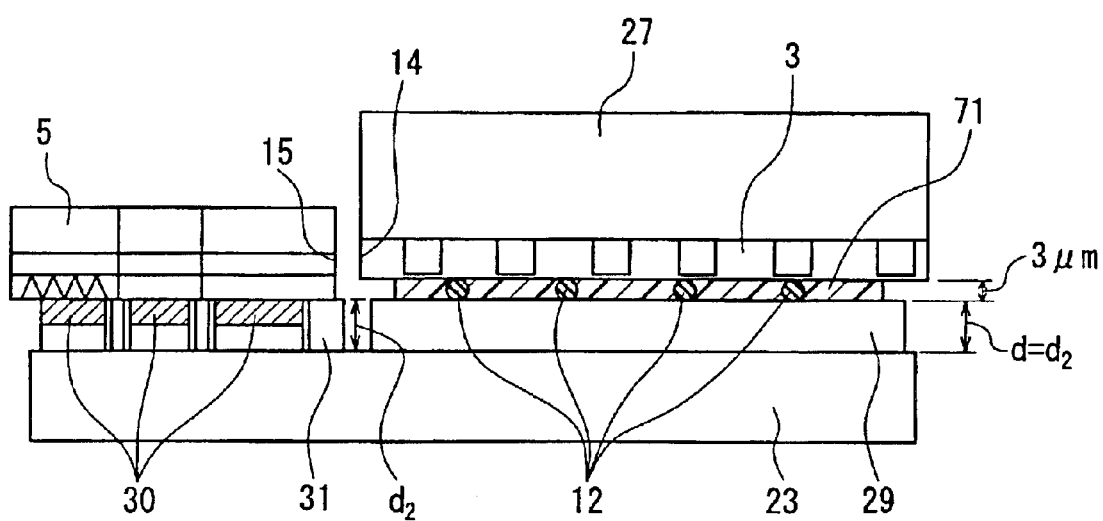
FIG. 4 is a plan view illustrating an effect produced by a submount for a laser source according to the first embodiment of the present invention.

Hereinafter, an effect produced by the submount according to the present embodiment will be described with reference to FIG. 4. In order to achieve high-efficiency optical coupling between a laser beam emitted from the DBR semiconductor laser 5 and the optical waveguide 3 of the optical waveguide type wavelength conversion device 1, not only the position of the laser beam emission portion 15 of the DBR semiconductor laser 5 in the height direction but also the position of the laser beam entrance portion 14 of the optical wave guide 3 formed in the optical waveguide type wavelength conversion device 1 in the height direction needs to be controlled with high precision. In the present embodiment, the size of spacers 12 is adjusted to carry out the position control of the optical the laser beam entrance portion 14 of the optical wave guide 3 in the height direction. Spacers whose sizes are controlled with high precision already have been developed for adjustment of a panel gap in a liquid crystal display and they are readily available as the spacer 12. Further, variations in diameter of the spacers are usually about ±0.1 μm.

In the laser source according to the present embodiment, optical coupling between a laser beam emitted from the DBR semiconductor laser 5 and the optical waveguide 3 of the optical waveguide type wavelength conversion device 1 reaches its maximum when the position of the laser beam entrance portion 14 of the optical wave guide 3 in the height direction is $d_2+3$ μm where $d_2$ is the thickness of the stopper portions 31. Thus, by setting the thickness d of the optical waveguide device fixing portion 29 to be $d=d_2$ and the diameter of the spacers 12 to be 3 μm as shown in FIG. 4, high-efficiency optical coupling can be achieved. When the thickness d of the optical waveguide device fixing portion 29 is equal to the thickness $d_2$ of the stopper portions 31, high-efficiency optical coupling can be achieved by using the spacers 12 whose diameter is 3 μm. On the other hand, when the thickness d of the optical waveguide device fixing portion 29 and the thickness $d_2$ of the stopper portions 31 are different from each other, the diameter of the spacers 12 needs to be set to $(d_2+3)-d$. In this case, it is necessary to measure the thickness of the stopper portions and adjust the spacers 12 so as to have an optimal size, which increases the processes to be performed.

The optical waveguide type wavelength conversion device 1 is fixed onto the optical waveguide device fixing portion 29 with an ultraviolet curable resin 71. The ultraviolet curable resin 71 can be cured by irradiation of ultraviolet rays. Thus, the optical waveguide type wavelength conversion device 1 can be fixed stably in a short time by irradiating ultraviolet rays after the optical coupling adjustment. The stopper portions 31 and the optical waveguide device fixing portion 29 can be formed by plating. Also, it is possible to form the stopper portions 31 and the optical waveguide device fixing portion 29 by etching.

Figure 5A:
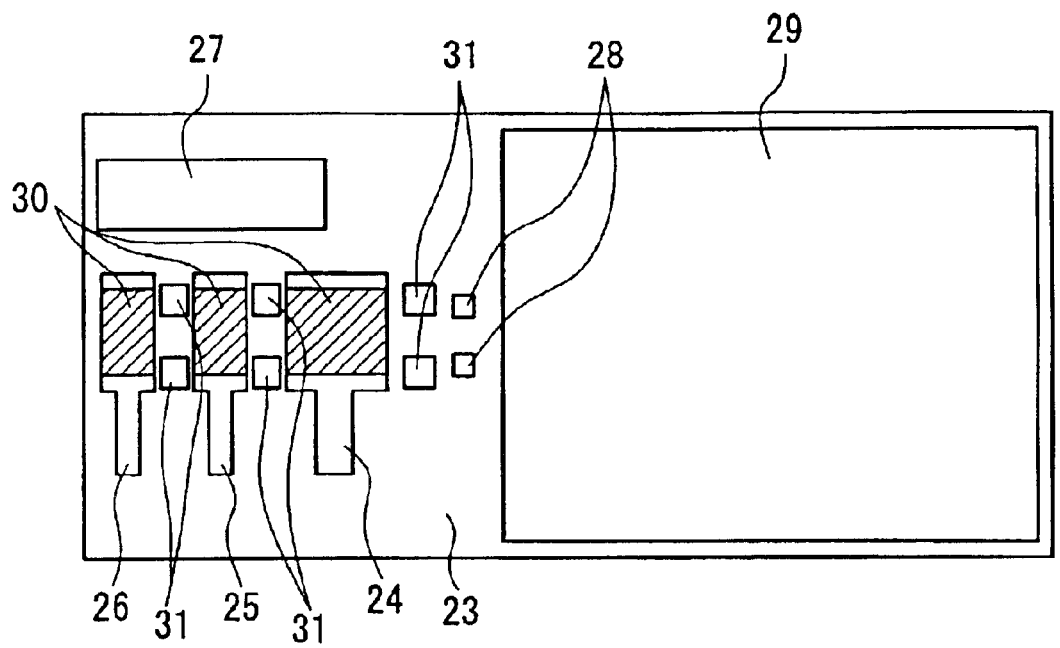
FIG. 5A is a plan view showing still another example of a submount for a laser source according to the first embodiment of the present invention.
Figure 5B:
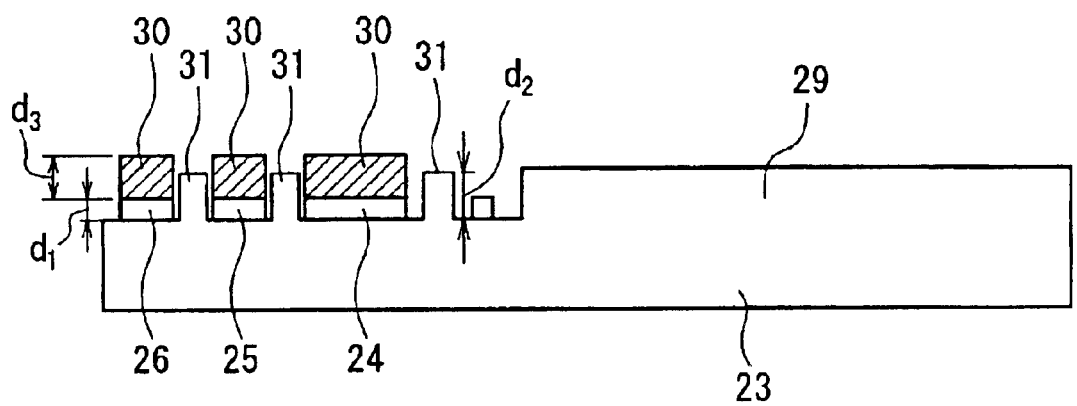
FIG. 5B is a front view of the same.

When forming the stopper portions 31 and the optical waveguide device fixing portion 29 by etching, a Si substrate as the submount 23 is etched to form the stopper portions 31 and the optical waveguide device fixing portion 29, and thereafter, the electrodes 24 to 27 are formed by sputtering or plating, as shown in FIGS. 5A and 5B. The Si substrate may be etched using a hydrofluoric-nitric acid etchant. Subsequently, films of the solder 30 are formed on the upper surfaces of the electrodes 24 to 26. If the stopper portions 31 and the optical waveguide device fixing portion 29 are formed by etching, a smaller amount of Au is required as compared with the case where they are formed by sputtering or plating, which contributes to lower cost. In addition, since the surface of the optical waveguide device fixing portion 29 is Si, an adhesive can achieve stronger adhesion thereto as compared with the case where the optical waveguide device fixing portion 29 is formed by sputtering or plating Au. In general, an adhesive achieves stronger adhesion to Si than to Au.

Figure 6A:
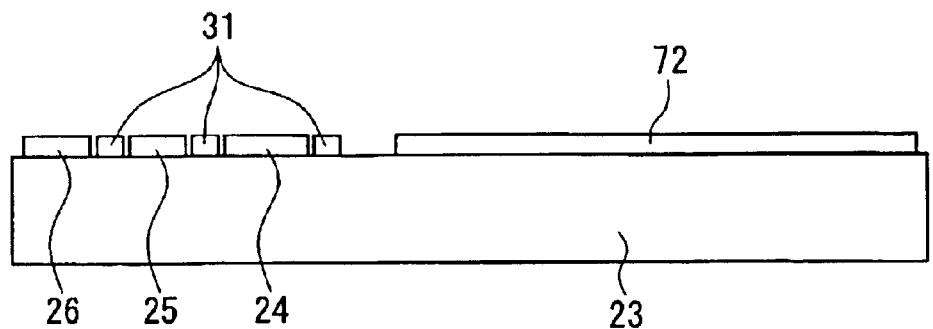
FIG. 6A is a plan view showing still another example of a submount for a laser source according to the first embodiment of the present invention.
Figure 6B:
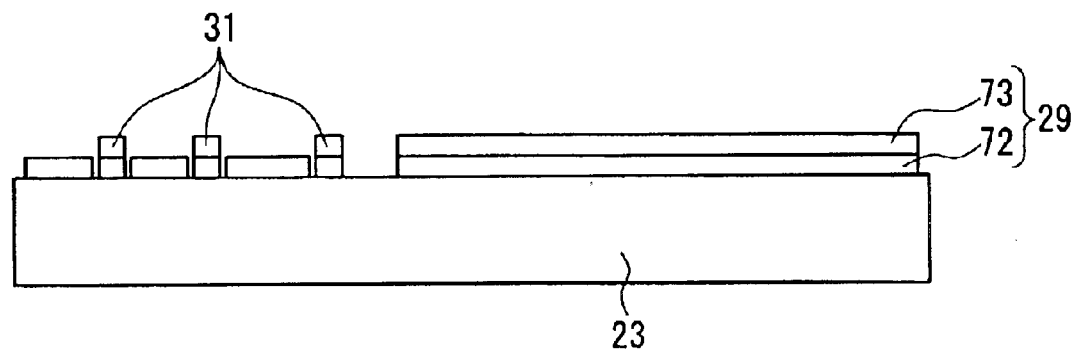
FIG. 6B is a front view of the same.

One of the methods for improving an adhesive strength between the optical waveguide type wavelength conversion device and the optical waveguide device fixing portion 29 when fixing the optical waveguide type wavelength conversion device onto the optical waveguide device fixing portion 29 with an adhesive is forming the surface of the optical waveguide device fixing portion 29 using a material other than Au. As described above, an adhesive generally exhibits poorer adhesion to Au than to other materials. On this account, an optical waveguide device fixing portion may be formed in the following manner. As shown in FIG. 6A, a first layer 72 is formed on a submount 23 as an optical waveguide device fixing portion so that the first layer has the surface of Au. In this case, electrode portions 24 to 26 and stopper portions 31 also are formed simultaneously with the formation of the first layer 72. Thereafter, as shown in FIG. 6B, a second layer 73 of the optical waveguide device fixing portion 29 and the stopper portions 31 are formed using a material to which an adhesive can achieve a suitable adhesion. In the present embodiment, the second layer 73 was formed using Al. As a result, the optical waveguide device fixing portion 29 was obtained to which an adhesive can achieve a suitable adhesion. It is to be noted here that a material other than Al, for example, Cr, Ta, Ti, Si, Cu, Mo, W, etc., may be used as a material of the second layer 73.

By using the submount 23 according to the present embodiment, a laser source was realized stably that can achieve high-efficiency optical coupling between a laser beam emitted from the DBR semiconductor laser 5 and the optical waveguide 3 of the optical waveguide type wavelength conversion device 1. Specifically, a 30-mW laser beam is coupled stably to the optical waveguide 3 of the optical waveguide type wavelength conversion device 1 with respect to a 50-mW laser output from the DBR semiconductor laser 5. Further, by having the oscillation wavelength of the DBR semiconductor laser 5 coincide with the phase matched wavelength of the optical waveguide type wavelength conversion device 1, bluish purple light of not less than 5 mW having a wavelength of 410 nm was obtained stably.

Second Embodiment

While the above-mentioned first embodiment has described the case where an optical waveguide type wavelength conversion device is used as an optical waveguide device, the present embodiment will describe the case where an optical fiber is used as an optical waveguide device. In a case where an optical fiber is used as an optical waveguide device, important factors are also to fix the respective devices with high precision; to achieve high-efficiency optical coupling; and to minimize transfer-loss.

Figure 7A:
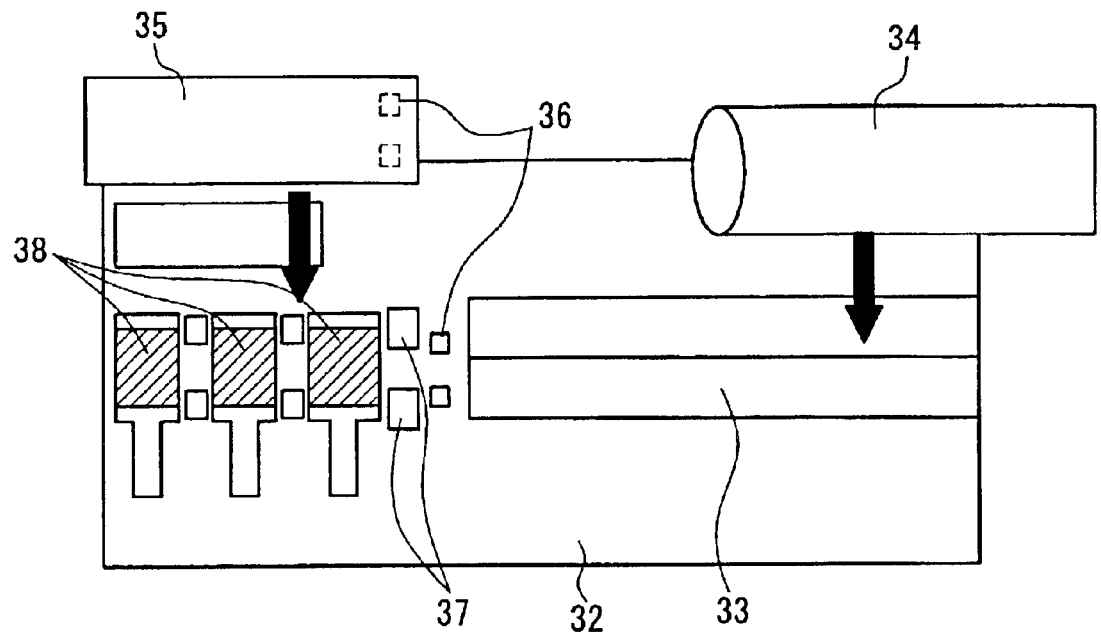
FIG. 7A is a plan view illustrating a method for mounting a surface mounting type optical module in which a semiconductor laser and a single mode optical fiber are coupled directly.
Figure 7B:
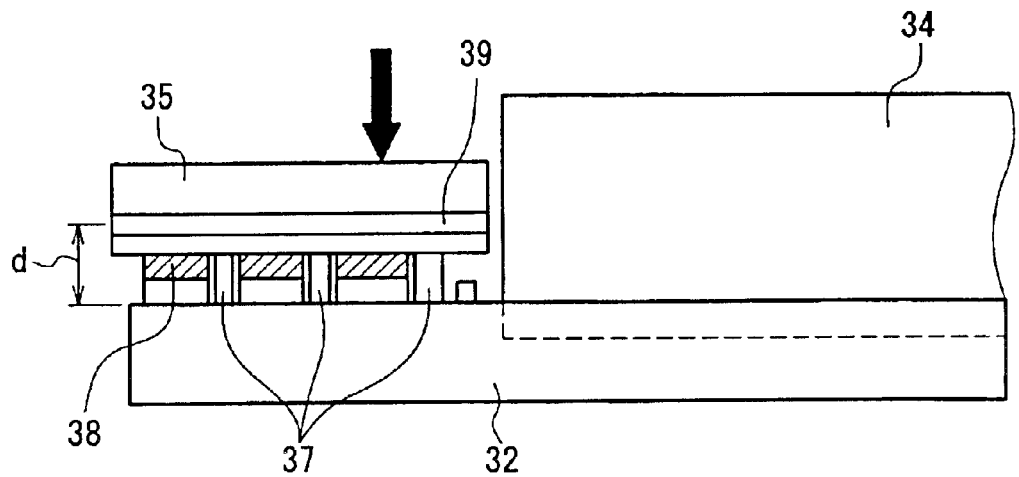
FIG. 7B is a front view of the same.
Figure 8:
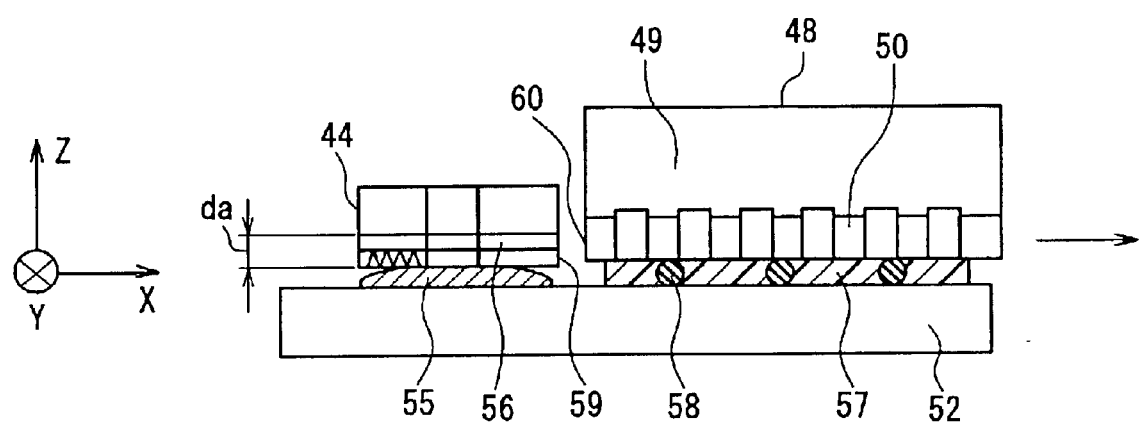
FIG. 8 is a plan view illustrating a conventional method of fabricating a laser source.
Figure 9A:
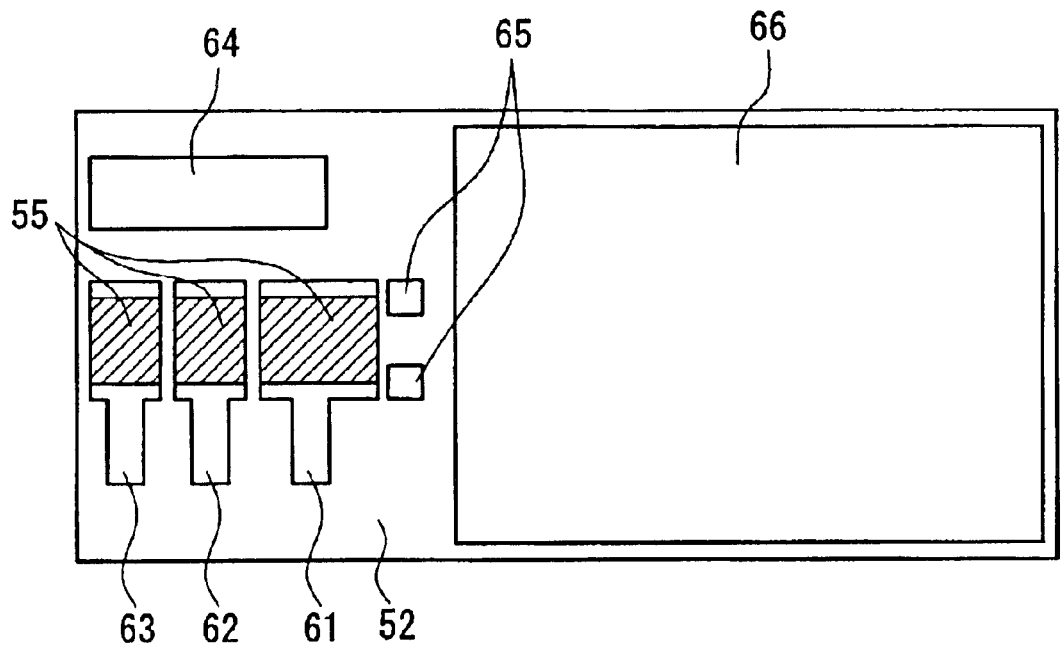
FIG. 9A is a plan view showing a conventional submount for a laser source.
Figure 9B:
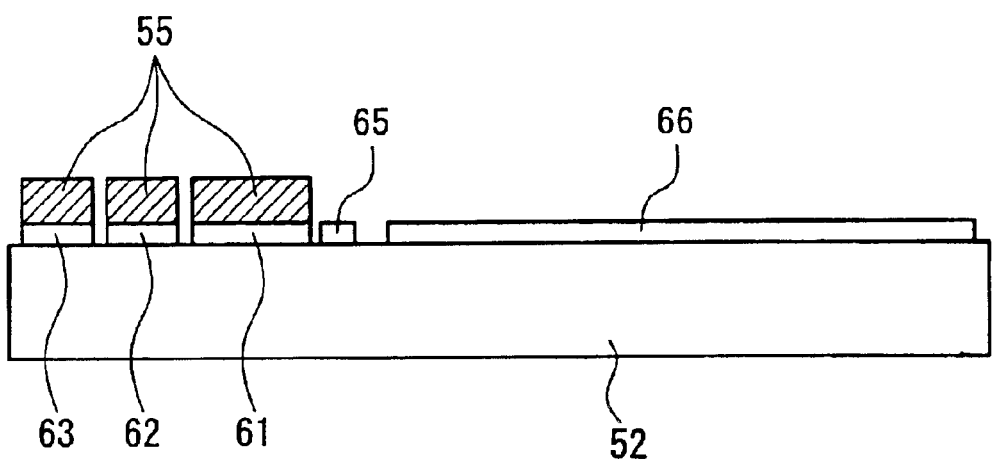
FIG. 9B is a front view of the same.
Figure 10A:
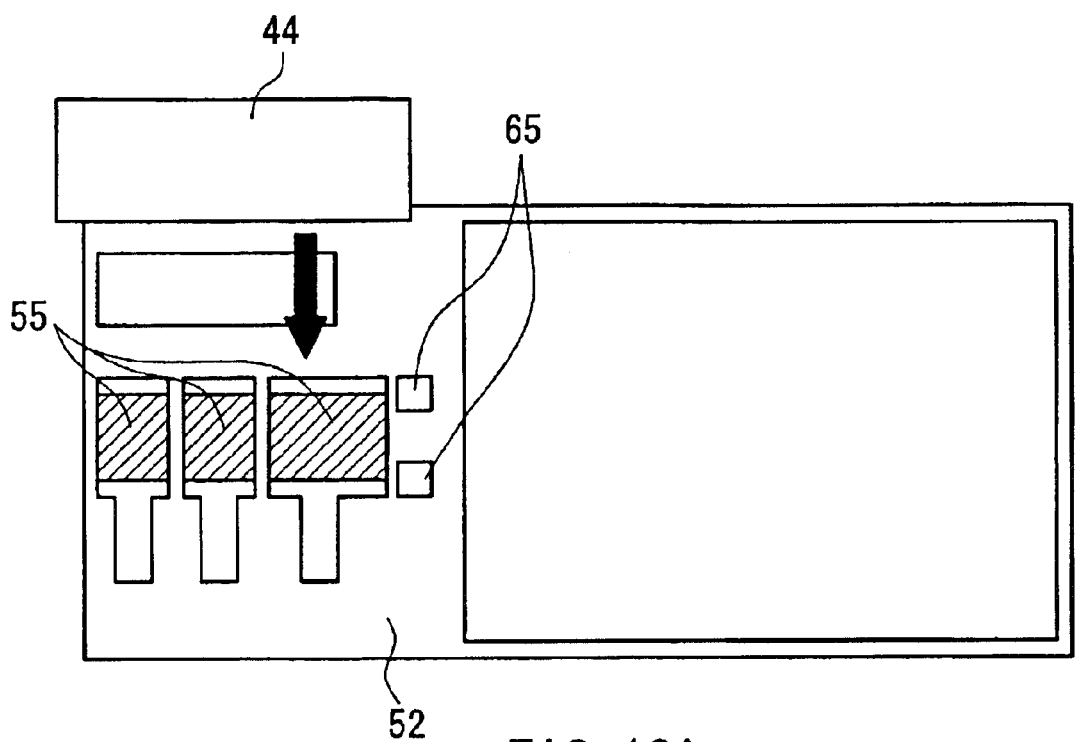
FIG. 10A is a plan view illustrating a conventional method for fixing a semiconductor laser to a submount.
Figure 10B:
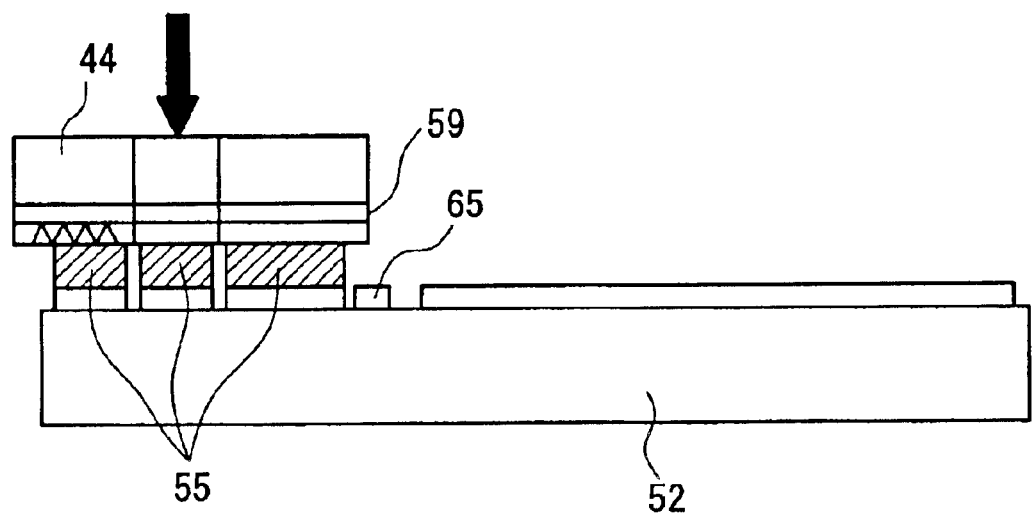
FIG. 10B is a front view of the same.
Figure 11:
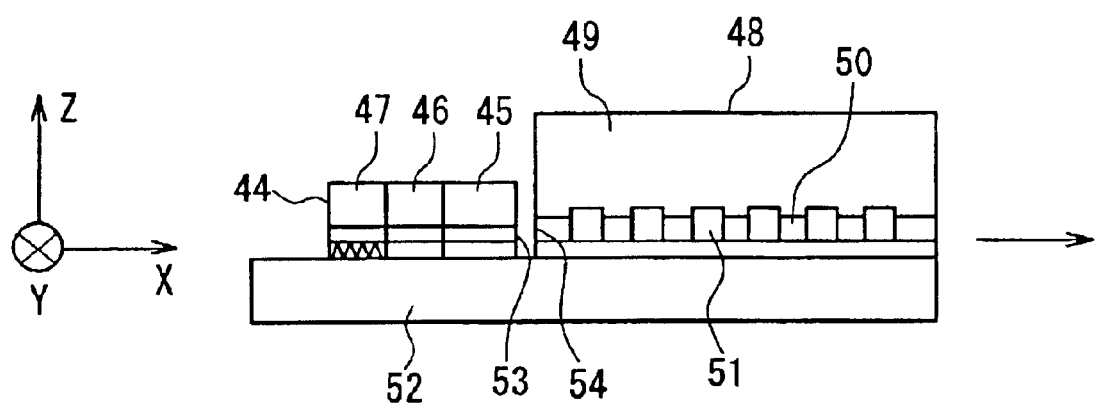
FIG. 11 is a front view showing a general configuration of a laser source.

Hereinafter, a method for mounting a surface mounting type optical module, in which a semiconductor laser and a single mode optical fiber are coupled directly, using a Si substrate with a V-groove will be described with reference to FIGS. 7A and 7B. As shown in FIG. 7A, an optical fiber 34 is mounted accurately in a V-groove 33 formed on a Si substrate as a submount 32. The V-groove 33 may be formed with high precision by anisotropic etching of Si. Similarly, the optical fiber 34 is produced with its outer dimension and core center controlled with high precision. Therefore, when the optical fiber 34 is fitted into and is fixed to the V-groove 33, the position of the optical fiber 34 can be controlled with high precision. Further, the position of a semiconductor laser 35 in the horizontal direction is adjusted with high precision in the following manner. Alignment markers 36 are formed on the submount 32 and the semiconductor laser 35. The alignment markers 36 are subjected to image recognition, so that the center of a V-groove 33 and a position of an emission point of the semiconductor laser 35 are detected, which enables position adjustment of the semiconductor laser 35 in the horizontal direction with high precision. Therefore, high-efficiency optical coupling can be achieved by carrying out position control of the semiconductor laser 35 in the height direction.

Conventionally, the position of the semiconductor laser 35 in the height direction has been determined by the thickness of a solder 38, and the position of a laser beam emission portion 39 of the semiconductor laser 35 in the height direction varies by about ±0.5 μm with respect to the desired position d (e.g. 8 μm). Thus, in the present embodiment, in order to solve this problem, stopper portions 37 are formed on the submount 32 as shown in FIGS. 7A and 7B, and the position of the semiconductor laser 35 in the height direction is controlled by the stopper portions 37 so that the position of the laser beam emission portion 39 is controlled with high precision. The variation in the position of the laser beam emission portion 39 in the height direction was improved from ±0.5 μm to ±0.1 μm and high-efficiency optical coupling was achieved stably.

An optical waveguide device according to the present invention can be used for various applications such as an optical waveguide type modulator, a device with a brunching waveguide, and the like.

As specifically described above, a laser source according to the present invention includes a submount, an electrode portion formed on the submount, and a semiconductor laser fixed to the electrode portion by means of an adhesive portion, wherein the submount includes a stopper portion, and the semiconductor laser is fixed to the electrode portion by means of the adhesive portion while being in contact with the stopper portion. Therefore, the position of a laser beam emission portion of the semiconductor laser in the height direction is controlled with high precision, which allows high-efficiency optical coupling between a laser beam emitted from the emission portion and the optical waveguide of the optical waveguide device to be achieved stably.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A laser source comprising:

a submount;

an electrode portion formed on the submount; and a semiconductor laser fixed to the electrode portion by means of an adhesive portion, wherein the submount comprises a stopper portion, and the semiconductor laser is fixed to the electrode portion by means of the adhesive portion while being in contact with the stopper portion.

2. The laser source according to claim 1, wherein relationships of $d_1 < d_2$ and $d_1 + d_3 \cong d_2$ are satisfied, where $d_1$ denotes a thickness of the electrode portion, $d_2$ denotes a thickness of the stopper portion as measured from an upper surface of the submount, and $d_3$ denotes a thickness of the adhesive portion.

3. The laser source according to claim 1, wherein the submount comprises a plurality of stopper portions.

4. The laser source according to claim 3, wherein an adhesive portion having a predetermined width is formed along an optical waveguide portion of the semiconductor laser, pairs of stopper portions face each other with the adhesive portion intervening therebetween, and a distance between the stopper portions facing each other is greater than the predetermined width of the adhesive portion and smaller than a width of the semiconductor laser.

5. The laser source according to claim 1, wherein the stopper portion is formed at a position apart from the electrode portion.

6. The laser source according to claim 1, wherein a groove is formed between the stopper portion and the electrode portion.

7. The laser source according to claim 1, wherein the semiconductor laser and the electrode portion are electrically contacted with each other via the adhesive portion.

8. The laser source according to claim 1 further comprising:

an optical waveguide device, the optical waveguide device being disposed on the submount.

9. The laser source according to claim 8, wherein an optical waveguide device fixing portion for fixing the optical waveguide device is formed on the submount, and a thickness of the optical waveguide device fixing portion is substantially the same as that of the stopper portion as measured from an upper surface of the submount.

10. The laser source according to claim 9, wherein the stopper portion and the optical waveguide device fixing portion are formed at the same time by the same process.

11. The laser source according to claim 9, wherein the stopper portion and the optical waveguide device fixing portion are formed by sputtering or plating.

12. The laser source according to claim 9, wherein a surface material of the optical waveguide device fixing portion is at least one material selected from the group consisting of Al, Cr, Ta, Ti, Si, Cu, Mo, and W.

13. The laser source according to claim 9, wherein the stopper portion and the optical waveguide device fixing portion are formed by etching.

14. The laser source according to claim 8, wherein the optical waveguide device is fixed to the submount with an ultraviolet curable resin via a spacer.

* * * * *